(12) United States Patent
Miyata et al.

(10) Patent No.: US 10,670,453 B2
(45) Date of Patent: Jun. 2, 2020

(54) SENSOR UNIT AND MUSICAL INSTRUMENT

(71) Applicants: YAMAHA CORPORATION, Hamamatsu-shi (JP); YUPO CORPORATION, Tokyo (JP)

(72) Inventors: Tomoya Miyata, Hamamatsu (JP); Kunio Hiyama, Hamamatsu (JP); Seiichiro Iida, Tokyo (JP); Hiroshi Koike, Ibaraki (JP); Hidekazu Kodama, Tokyo (JP)

(73) Assignees: YAMAHA CORPORATION, Hamamatsu-Shi (JP); YUPO CORPORATION, Tokyo (JP)

( * ) Notice: Subject to any disclaimer, the term of this patent is extended or adjusted under 35 U.S.C. 154(b) by 32 days.

(21) Appl. No.: 15/907,783

(22) Filed: Feb. 28, 2018

(65) Prior Publication Data

US 2018/0209838 A1 Jul. 26, 2018

Related U.S. Application Data

(63) Continuation of application No. PCT/JP2016/075244, filed on Aug. 29, 2016.

(30) Foreign Application Priority Data

Sep. 30, 2015 (JP) .................................. 2015-195323

(51) Int. Cl.
*G10H 3/14* (2006.01)
*G01H 11/08* (2006.01)
(Continued)

(52) U.S. Cl.
CPC .............. *G01H 11/08* (2013.01); *G10H 3/14* (2013.01); *G10H 3/143* (2013.01); *G10H 3/146* (2013.01);
(Continued)

(58) Field of Classification Search
CPC ..... G01H 11/08; G10H 3/143; G01N 29/2437
See application file for complete search history.

(56) References Cited

U.S. PATENT DOCUMENTS

| 4,054,808 A | 10/1977 | Tanaka |
| 2007/0041273 A1 | 2/2007 | Shertukde et al. |

(Continued)

FOREIGN PATENT DOCUMENTS

| CN | 103217210 A | 7/2013 |
| CN | 103594076 A | 2/2014 |

(Continued)

OTHER PUBLICATIONS

Extended European Search Report issued in European Appln. No. 16850995.8 dated Apr. 3, 2019.
(Continued)

*Primary Examiner* — Herbert K Roberts
(74) *Attorney, Agent, or Firm* — Rossi, Kimms & McDowell LLP

(57) ABSTRACT

A sensor unit capable of protecting a piezoelectric element and detecting vibration and sound is provided. The sensor unit comprises a sheet-like piezoelectric element having a porous layer, and a sound propagation sheet covering at least one face of the piezoelectric element and permitting transmission of sound from a first face toward a second face of the sound propagation sheet. A difference in acoustic pressure level between the sound incident on the sound propagation sheet and the transmitted sound is preferably no greater than 10 dB. A surface density of the sound propagation sheet is preferably from 0.03 g/m$^2$ to 100 g/m$^2$. The sound propagation sheet is preferably flexible and preferably has voids. The sensor unit preferably further comprises a sound insulation sheet covering another face of the piezoelectric element and substantially preventing transmission of sound from a second face toward a first face of the sound insulation sheet.

6 Claims, 28 Drawing Sheets

(51) Int. Cl.
  *H01L 41/193* (2006.01)
  *H01L 41/053* (2006.01)
  *H01L 41/113* (2006.01)
  *H04R 17/02* (2006.01)

(52) U.S. Cl.
  CPC ........ *H01L 41/053* (2013.01); *H01L 41/0533* (2013.01); *H01L 41/113* (2013.01); *H01L 41/1132* (2013.01); *H01L 41/193* (2013.01); *G10H 2220/535* (2013.01); *H04R 17/02* (2013.01); *H04R 17/025* (2013.01)

(56) References Cited

U.S. PATENT DOCUMENTS

| | | | |
|---|---|---|---|
| 2007/0049837 A1* | 3/2007 | Shertukde | A61B 5/0408 600/528 |
| 2014/0210309 A1 | 7/2014 | Miyoshi | |
| 2015/0053070 A1 | 2/2015 | Miyata | |
| 2015/0247777 A1* | 9/2015 | Kondou | F17D 5/06 73/49.1 |

FOREIGN PATENT DOCUMENTS

| | | |
|---|---|---|
| JP | 06050095 U | 7/1994 |
| JP | 2010089495 A | 4/2010 |
| JP | 2011216661 A | 10/2011 |
| JP | 2013249367 A | 12/2013 |
| WO | 2007002116 A2 | 1/2007 |
| WO | 2014185526 A1 | 11/2014 |

OTHER PUBLICATIONS

International Search Report issued in Intl. Appln. No. PCT/JP2016/075244 dated Nov. 1, 2016. English translation provided.

Written Opinion issued in Intl. Appln. No. PCT/JP2016/075244 dated Nov. 1, 2016.

Office Action issued in Chinese Appln. No. 201680054404.6 dated Jul. 3, 2019. English translation provided.

Office Action issued in European Appln. No. 16850995.8 dated Jan. 27, 2020.

Office Action issued in Chinese Appln. No. 201680054404.6 dated Mar. 19, 2020. English translation provided.

* cited by examiner

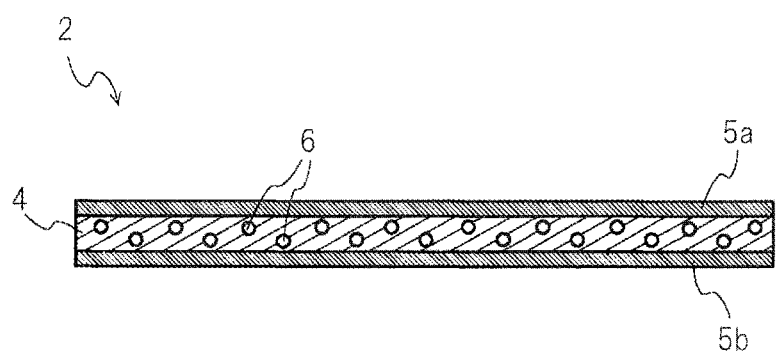
F I G. 2

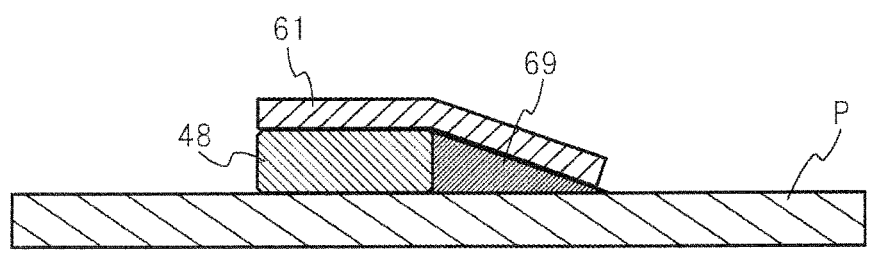
F I G. 11

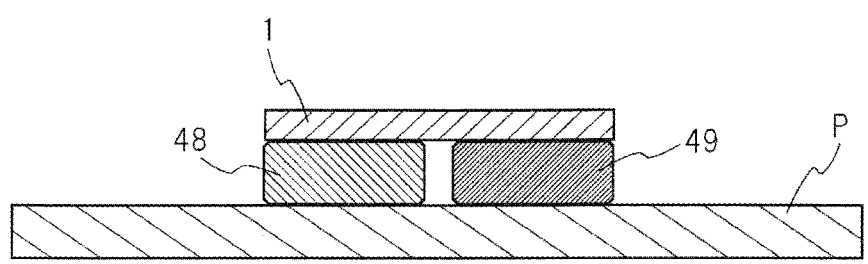
F I G. 13

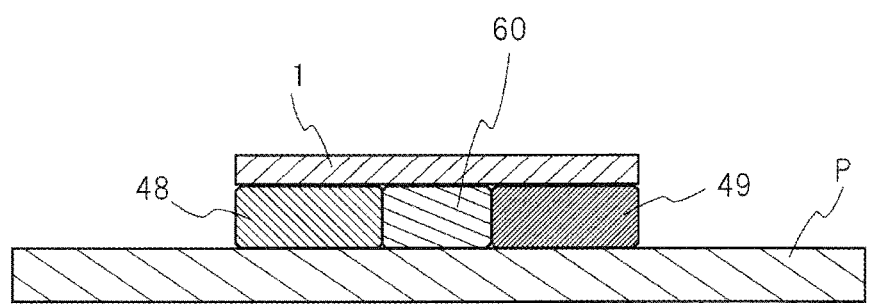
F I G. 15

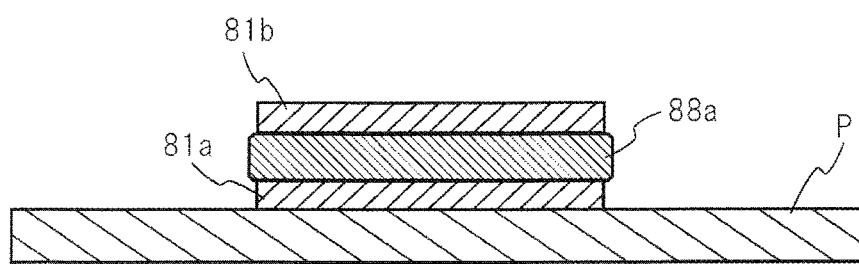
F I G. 16

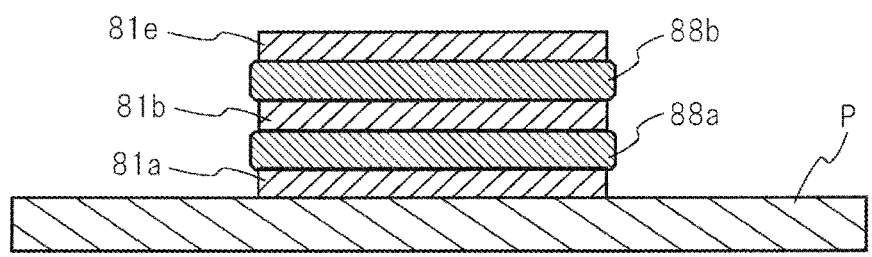
F I G. 19

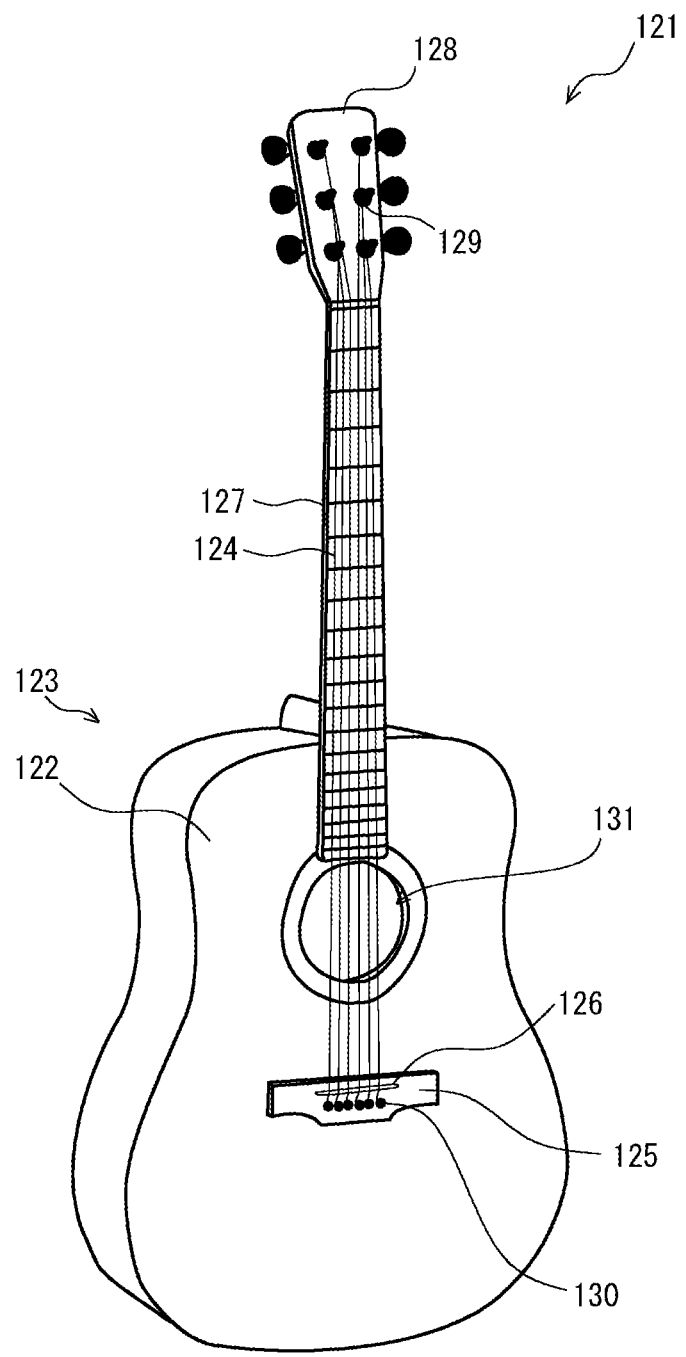
F I G. 24

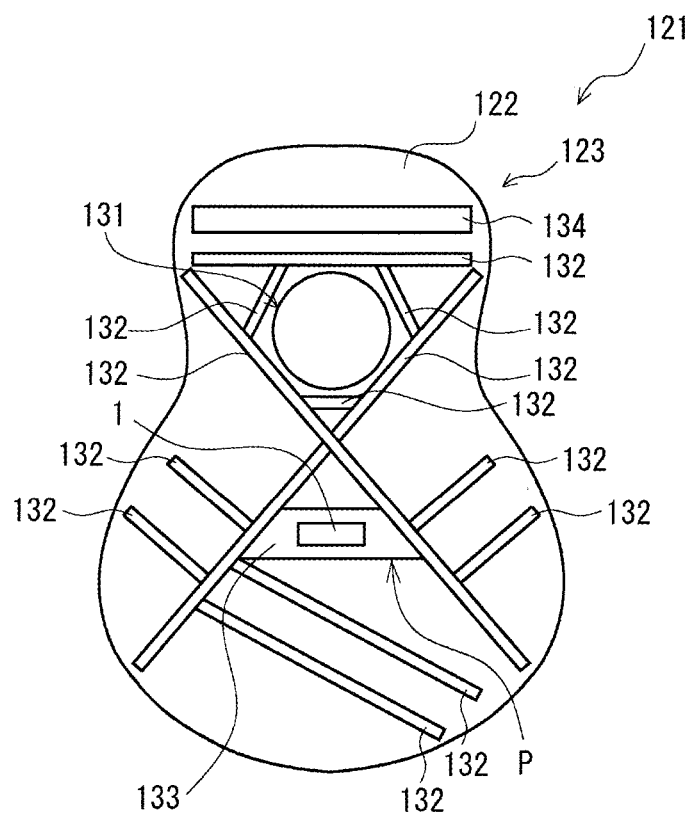
F I G. 25

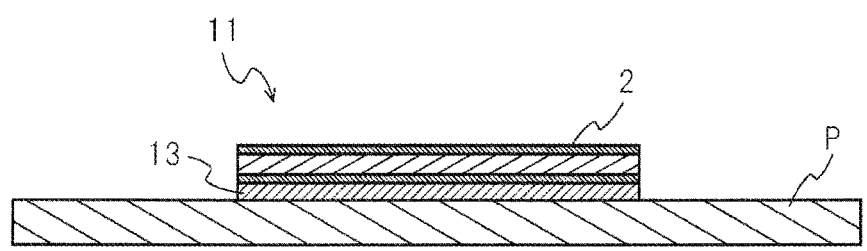
F I G. 26

NEW SHEET

SENSOR UNIT AND MUSICAL INSTRUMENT

BACKGROUND OF THE INVENTION

The present invention relates to a sensor unit and a musical instrument.

DESCRIPTION OF THE RELATED ART

Conventionally, a vibration detection sensor has been known which is mounted on a vibrating part of a musical instrument and capable of detecting vibration of the vibrating part and outputting the vibration as an electrical signal. As such a vibration detection sensor, a sensor has been known in which a piezoelectric element is used, the piezoelectric element comprising a porous resin film and electrode layers disposed on both faces of the porous resin film (for example, see Japanese Unexamined Patent Application, Publication No. 2010-89495). Such a sensor, in which the piezoelectric element with a porous layer is used, is suited for detection of sound owing to softness in a thickness direction, and does not inhibit vibration of the musical instrument owing to lightweight properties and thinness. Therefore, such a sensor in which the piezoelectric element comprising a porous layer is used is suitably used as a pickup for a musical instrument that detects both vibration and sound. It is to be noted that the term "sound" as referred to means a compressional wave transmitted through air, and the term "vibration" as referred to means vibration that propagates in a solid to a sensor.

In the case of using the aforementioned sensor in a musical instrument, etc., prevention of damage to the piezoelectric element is required in order to maintain detection accuracy of the sensor. However, a protection film covering the sensor for preventing damage to the piezoelectric element may inhibit detection of sound.

PRIOR ART DOCUMENTS

Patent Documents

Patent Document 1: Japanese Unexamined Patent Application, Publication No. 2010-89495

SUMMARY OF THE INVENTION

Problems to be Solved by the Invention

The present invention was made in view of the foregoing circumstances, and an object of the present invention is to provide a sensor unit that is capable of protecting a piezoelectric element and detecting both vibration and sound, and a musical instrument comprising the sensor unit.

Means for Solving the Problems

According to an aspect of the invention made for solving the aforementioned problems, a sensor unit comprises: a sheet-like piezoelectric element having a porous layer, wherein the sensor unit further comprises a sound propagation sheet that covers at least one face of the piezoelectric element, and permits sound that is incident on a first face of the sound propagation sheet to be transmitted toward a second face of the sound propagation sheet.

By virtue of the sound propagation sheet covering the one face of the piezoelectric element, the sensor unit is enabled to protect from damage the one face of the piezoelectric element that detects sound, and consequently capable of maintaining sound detection accuracy. In addition, since the sound propagation sheet covering the one face of the piezoelectric element permits the sound that is incident on the first face of the sound propagation sheet toward the second face of the sound propagation sheet, the sound from the one face side of the sensor unit is less likely to be muffled by the sound propagation sheet, and the sensor unit is capable of detecting both vibration and sound.

A difference in an acoustic pressure level between the sound incident on the sound propagation sheet and the sound transmitted through the sound propagation sheet is preferably no greater than 10 dB. Due to using the sound propagation sheet in which the difference in an acoustic pressure level between the sound incident on the sound propagation sheet and the transmitted sound is no greater than the upper limit, reliable inhibition of muffling of the sound incident on the first face of the sound propagation sheet is enabled, and consequently the maintenance of the sound detection accuracy is further facilitated. As a result, the sensor unit may serve as a microphone.

A surface density of the sound propagation sheet is preferably no less than 0.03 $g/m^2$ and no greater than 100 $g/m^2$. Due to using the sound propagation sheet having the surface density falling within the aforementioned range, the reliable protection of the one face of the piezoelectric element and the reliable inhibition of muffling of the sound incident on the first face of the sound propagation sheet are simultaneously attained, and consequently the maintenance of sound detection accuracy is further facilitated.

The sound propagation sheet is preferably flexible. Due to the flexibility, the sound propagation sheet is capable of covering the piezoelectric element without pressing it, and consequently durability of the piezoelectric element is improved. In addition, due to the flexibility of the sound propagation sheet, propagation of the vibration caused by the sound incident on the first face of the piezoelectric element is facilitated, and consequently the maintenance of the sound detection accuracy is further facilitated. It is to be noted that the terms "flexible" and "flexibility" as referred to mean that, for example, when a test piece of 5 mm in width and 10 mm in length is supported on one shorter side thereof so as to be horizontally oriented at the support position, the distance between the positions of the two opposed shorter sides in a vertical direction is no less than 5 mm.

The sound propagation sheet preferably has voids. Due to the sound propagation sheet having voids, the sound incident on the first face of the sound propagation sheet is transmitted through the voids, and consequently the propagation of the sound to the piezoelectric element and the detection of the sound are further facilitated.

It is preferred that the sensor unit further comprises a sound insulation sheet that covers another face of the piezoelectric element and substantially prevents sound that is incident on a second face of the sound insulation sheet from being transmitted toward a first face of the sound insulation sheet. Due to covering the another face of the piezoelectric element with the sound insulation sheet that substantially prevents sound incident on the second face of the sound insulation sheet from being transmitted toward the first face of the sound insulation sheet, the sound from the other face side of the sensor unit is prevented, and consequently the sound from the one face side of the sensor unit is more accurately detected. It is to be noted that the expression "to substantially prevent sound from being transmitted" as referred to means not only complete blockage of sound transmission but also muffling of sound to such a degree that the sound escapes detection by the piezoelectric element.

According to another aspect of the invention made for solving the aforementioned problems, a musical instrument comprises the sensor unit according to the aforementioned aspect.

The musical instrument is capable of detecting both the vibration and the sound by virtue of the sensor unit, and consequently capable of transforming an original tone of the musical instrument into an electrical signal and outputting the electrical signal.

Effects of the Invention

As explained in the foregoing, the sensor unit and the musical instrument according to the aspects of the present invention are capable of detecting both the vibration and the sound while protecting the piezoelectric element.

BRIEF DESCRIPTION OF THE DRAWINGS

FIG. 2 is a schematic cross sectional view of a piezoelectric element of FIG. 1;

FIG. 11 is a schematic cross sectional view for explaining a mounting configuration of the sensor unit different from those of FIGS. 7 to 10;

FIG. 13 is a schematic cross sectional view for explaining a mounting configuration of the sensor unit different from those of FIGS. 7 to 12;

FIG. 15 is a schematic cross sectional view for explaining a mounting configuration of the sensor unit different from those of FIGS. 7 to 14;

FIG. 16 is a schematic cross sectional view for explaining a mounting configuration of the sensor unit different from those of FIGS. 7 to 15;

FIG. 19 is a schematic cross sectional view for explaining a mounting configuration of the sensor unit different from those of FIGS. 7 to 18;

FIG. 24 is a schematic perspective view of a string instrument comprising the sensor unit of FIG. 1;

FIG. 25 is a schematic plan view of an inner side of a soundboard of the string instrument of FIG. 24; and FIG. 26 is a schematic cross sectional view of a sensor unit according to another embodiment.

DESCRIPTION OF EMBODIMENTS

Embodiments of the present invention will be described in detail hereinafter, with appropriate reference to the drawings.

First Embodiment

Sensor Unit

Figure 1:
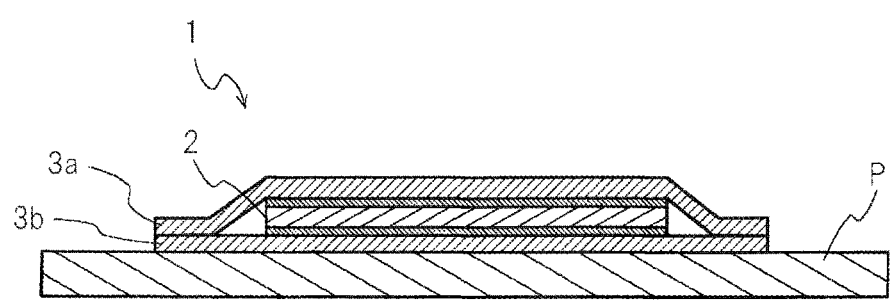
FIG. 1 is a schematic cross sectional view of a sensor unit according to a first embodiment of the present invention.

A sensor unit 1 of FIG. 1 comprises a sheet-like piezoelectric element 2 having a porous layer. The sensor unit 1 further comprises: a first sound propagation sheet 3a that covers one face of the piezoelectric element 2 and permits sound that is incident on the first face thereof to be transmitted toward the second face thereof; and a second sound propagation sheet 3b that covers the another face of the piezoelectric element 2 and permits sound that is incident on the second face thereof toward the first face thereof.

<Piezoelectric Element>

The piezoelectric element 2 is formed in a plate-like shape, substantially rectangular in a planar view. The piezoelectric element 2 comprises a porous layer 4 and a pair of electrode layers (first electrode layer 5a and second electrode layer 5b), as illustrated in FIG. 2. The piezoelectric element 2 generates voltage in accordance with an amount of compression of the porous layer 4.

(Porous Layer)

The principal component of the porous layer 4 is preferably an electrically chargeable material. For example, by polypropylene (PP), polyethylene (PE), polyethylene terephthalate (PET), polyvinyl chloride, a polyolefin resin, a fluorine-containing resin, and the like. The term "principal component" as referred to means a component which is of the highest content, for example a component of which content is 50% or more by mass.

The porous layer 4 is typically formed by subjecting to a polarization process a plate-like member comprising any of the aforementioned resins as a principal component. A procedure for the polarization process is, for example, a procedure of injecting charge by applying a high voltage of direct current or pulsed current; a procedure of injecting charge by irradiation with an ionizing radiation such as γ-rays, electron beams, etc.; a procedure of injecting charge by corona discharge; and the like.

The lower limit of an average thickness of the porous layer 4 is preferably 30 μm and more preferably 50 μm. Meanwhile, the upper limit of the average thickness of the porous layer 4 is preferably 150 μm and more preferably 100 μm. When the average thickness of the porous layer 4 is less than the lower limit, processability may be impaired due to reduced strength. To the contrary, when the average thickness of the porous layer 4 is greater than the upper limit, efficiency of the polarization process may be decreased.

The lower limit of a modulus of elasticity of the porous layer 4 in a direction vertical to the thickness direction is preferably 1 GPa and more preferably 1.5 GPa. Meanwhile, the upper limit of the modulus of elasticity of the porous layer 4 in the direction vertical to the thickness direction is preferably 3 GPa and more preferably 2.5 GPa. When the modulus of elasticity of the porous layer 4 in the direction vertical to the thickness direction is less than the lower limit, a strain in the direction vertical to the thickness direction may become greater and consequently the vibration detection accuracy may be decreased. To the contrary, when the modulus of elasticity of the porous layer 4 in the direction vertical to the thickness direction is greater than the upper limit, the porous layer 4 is less likely to follow the expansion and contraction of the first electrode layer 5a and the second electrode layer 5b, and consequently the first electrode layer 5a and the second electrode layer 5b may be likely to be separated from the porous layer 4. It is to be noted that the term "modulus of elasticity" as referred to means a value measured pursuant to JIS-K7161 (2014).

The lower limit of a modulus of elasticity of the porous layer 4 in the thickness direction is preferably 0.1 GPa and more preferably 0.3 GPa. Meanwhile, the upper limit of the modulus of elasticity of the porous layer 4 in the thickness direction is preferably 10 GPa and more preferably 2 GPa. When the modulus of elasticity of the porous layer 4 in the thickness direction is less than the lower limit, a large error in vibration detection may arise. To the contrary, when the modulus of elasticity of the porous layer 4 in the thickness direction is greater than the upper limit, detection of slight vibration may be difficult.

The lower limit of a density of the porous layer 4 is preferably 0.2 g/cm$^3$ and more preferably 0.4 g/cm$^3$. Meanwhile, the upper limit of the density of the porous layer 4 is preferably 0.8 g/cm$^3$ and more preferably 0.6 g/cm$^3$. When the density of the porous layer 4 is less than the lower limit, the porous layer 4 may decrease in strength. To the contrary, when the density of the porous layer 4 is greater than the upper limit, deformation of the porous layer 4 may be insufficient and consequently the vibration detection accuracy may be decreased.

The porous layer 4 has a plurality of pores 6. The shape and size of the pores 6 are not particularly limited; however, the lower limit of an average height of the pores 6 is preferably 1 μm, and more preferably 3 μm, for example. Meanwhile, the upper limit of the average height of the pores 6 is preferably 30 μm and more preferably 15 μm. When the average height of the pores 6 is less than the lower limit, the deformation of the porous layer 4 may be insufficient. To the contrary, when the average height of the pores 6 is greater than the upper limit, the porous layer 4 may decrease in strength. It is to be noted that the average height of the pores 6 is obtained by measuring maximum lengths of arbitrary 20 pores in the thickness direction on an arbitrary cross section of the porous layer 4 in the thickness direction and by calculating an arithmetic average of the maximum lengths.

The lower limit of the porosity of the porous layer 4 is preferably 20% and more preferably 30%. Meanwhile, the upper limit of the porosity of the porous layer 4 is preferably 80% and more preferably 70%. When the porosity of the porous layer 4 is less than the lower limit, the deformation of the porous layer 4 may be insufficient, and consequently the detection accuracy may be insufficient. To the contrary, when the porosity of the porous layer 4 is greater than the upper limit, the porous layer 4 may decrease in strength. It is to be noted that the term "porosity" as referred to means a proportion of the pores per unit volume. The porosity ε (%) may be obtained by the equation (1) below based on a mass W (g), an apparent volume V (cm$^3$) of the porous layer 4, and a true density ρ (g/cm$^3$). The true density ρ may be obtained by the equation (2) below based on a volume $V_0$ (cm$^3$) of the porous layer 4 having been heated by heat pressing at 200° C. for 5 min with a load of 1 kg/cm$^2$, and then cooled by cool pressing. Furthermore, the porosity ε may be given by the equation (3) below, which is obtained by plugging the equation (2) into the equation (1).

$$\varepsilon = (1 - W/\rho V) \times 100 \quad (1)$$

$$\rho = W/V_0 \quad (2)$$

$$\varepsilon = 1 - V_0/V \quad (3)$$

(Electrode Layer)

The first electrode layer 5a and the second electrode layer 5b are overlaid on the both faces of the porous layer 4, respectively. The first electrode layer 5a and the second electrode layer 5b are connected to respective lead wires (not shown in the Figure), which are in turn connected to an output terminal (not shown in the Figure).

A material for forming the first electrode layer 5a and the second electrode layer 5b is not particularly limited as long as the material is electrically conductive, and is, for example, various types of metals such as aluminum and silver; alloys of these metals; carbon; and the like.

An average thickness of each of the first electrode layer 5a and the second electrode layer 5b is not particularly limited, and may be, for example, 0.1 μm or more and 30 μm or less. When the average thickness of each of the first electrode layer 5a and the second electrode layer 5b is less than the lower limit, damages such as rupture may occur in the first electrode layer 5a and the second electrode layer 5b. To the contrary, when the average thickness of each of the first electrode layer 5a and the second electrode layer 5b is greater than the upper limit, the vibration may not be accurately detected.

A procedure for overlaying the first electrode layer 5a and the second electrode layer 5b on the porous layer 4 is not particularly limited, and is exemplified by: vapor deposition of aluminum; printing with conductive carbon ink; application and drying of a silver paste; and the like.

The porous layer 4 has the pores in an inner part thereof, and is therefore soft and prone to be scratched. In addition, the electrode layer 5 formed on the surface of the porous layer 4 is also soft and prone to be scratched. Therefore, the piezoelectric element 2 constituted of these layers is required to be covered with a sheet in order to prevent scratches. The piezoelectric element 2 is covered with a sound propagation sheet for permitting the piezoelectric element 2 to detect sound.

<Sound Propagation Sheet>

The first sound propagation sheet 3a and the second sound propagation sheet 3b are substantially rectangular sheets formed from a material of the same type and each having such a size that a range surrounded by an outer periphery of the piezoelectric element 2 is covered in a planar view. The first sound propagation sheet 3a covers the one face of the piezoelectric element 2, while the second sound propagation sheet 3b covers the another face of the piezoelectric element 2. The first sound propagation sheet 3a and the second sound propagation sheet 3b are arranged such that outer peripheries thereof substantially correspond to each other in a planar view, and are fixed to each other on circumferential edges thereof. Accordingly, the piezoelectric element 2 is surrounded by the first sound propagation sheet 3a and the second sound propagation sheet 3b. It is to be noted that a procedure for fixing the first sound propagation sheet 3a and the second sound propagation sheet 3b is not particularly limited, and may be, for example: fixing by an adhesive or a tacky material; fixing by inserting pins, such as stapling; and fixing by sewing.

The sensor unit 1 is disposed such that the another face of the second sound propagation sheet 3b is in contact with a surface of a vibrating body P such as a musical instrument, which is a target of vibration detection. Since the first sound propagation sheet 3a permits sound that is incident on the first face thereof to be transmitted toward the second face thereof, the sensor unit 1 arranged as described above mainly detects sound being propagated in the first sound propagation sheet 3a and detects the vibration of the vibrating body P being propagated in the second sound propagation sheet 3b.

The upper limit of the difference in an acoustic pressure level between the sound incident on the first sound propagation sheet 3a and the transmitted sound is preferably 10 dB and more preferably 5 dB. Meanwhile, the lower limit of the difference in the acoustic pressure level is preferably 1 dB and more preferably 2 dB. When the difference in the acoustic pressure level is greater than the upper limit, the acoustic pressure level of the sound being propagated to the piezoelectric element 2 may be too low, and the sound may be less likely to be detected by the piezoelectric element 2. To the contrary, when the difference in the acoustic pressure level is less than the lower limit, it may be difficult to maintain an effect of protecting the piezoelectric element 2 provided by the first sound propagation sheet 3a. The difference in an acoustic pressure level between the sound incident on the first sound propagation sheet 3a and the transmitted sound may be obtained in a relative manner, on the basis of a difference between results of detection of a test tone by, for example: the piezoelectric element 2 of the sensor unit 1 in which the piezoelectric element 2 is covered by the first sound propagation sheet 3a; and the piezoelectric element 2 of the sensor unit 1 from which the first sound propagation sheet 3a has been removed. In other words, the difference in an acoustic pressure level may be obtained in a relative manner, through comparison between: a signal level of the transmitted sound detected in the state in which the piezoelectric element 2 is covered by the first sound propagation sheet 3a; and a signal level of the incident sound detected in the state in which the first sound propagation sheet 3a has been removed from the sensor unit 1. Specifically, the difference in an acoustic pressure level is measured by, for example, arranging the aforementioned two types of sensor units and a speaker in an anechoic chamber, and emitting sound from the speaker. In this case, a face, which is opposite to the measurement target, of each of the two types of sensor units is preferably shielded with a rigid body or a sound-absorbing member. The measurement for obtaining the difference in an acoustic pressure level is carried out, for example, with a frequency of no less than 100 Hz and no greater than 5,000 Hz.

The lower limit of a surface density of the first sound propagation sheet 3a and the second sound propagation sheet 3b is preferably 0.03 $g/m^2$ and more preferably 1 $g/m^2$. Meanwhile, the upper limit of the surface density of the first sound propagation sheet 3a and the second sound propagation sheet 3b is preferably 100 $g/m^2$ and more preferably 50 $g/m^2$. When the surface density is less than the lower limit, the first sound propagation sheet 3a and the second sound propagation sheet 3b may decrease in strength and consequently an effect of protecting the piezoelectric element 2 provided by the first sound propagation sheet 3a and the second sound propagation sheet 3b may be insufficient. To the contrary, when the surface density is greater than the upper limit, transmission of sound may be hindered, and consequently it may be difficult for the piezoelectric element 2 to detect the sound.

The first sound propagation sheet 3a and the second sound propagation sheet 3b are only required to be capable of permitting sound that is incident on the first/second face to be transmitted toward the second/first face, and a material for forming these sheets is not particularly limited. For example, resins, metals, inorganic materials, organic materials, and the like may be used as the material for forming the first sound propagation sheet 3a and the second sound propagation sheet 3b.

In the case of using a resin as the material for forming the first sound propagation sheet 3a and the second sound propagation sheet 3b, a principal component of the material is exemplified by PET, PP, polystyrene (PS), polycarbonate (PC), polyphenylene sulfide (PPS), polymethyl methacrylate (PMMA), polyetherimide (PEI), polyimide (PI), polyethylene naphthalate (PEN), triacetyl cellulose (TAC), cyclic olefin-derived resins, and the like. Alternatively, a metal film of aluminum, nickel, platinum, or the like may also be used as the first sound propagation sheet 3a or the second sound propagation sheet 3b. Although the metal film needs to be thin in order to propagate sound, such a thin film may be easily broken. Given this, it is preferred that the metal film is formed so as to adhere to the surface of the piezoelectric element 2, for example by vapor deposition. In this case, the metal film having a thickness of about 10 nm is capable of propagating sound. When a reduction in sound detection efficiency is acceptable, the metal film may have a greater thickness.

The first sound propagation sheet 3a preferably has voids. Due to the sound propagation sheet 3a having voids in an inner part, the sound that is incident on the first face thereof is transmitted through the voids toward the second face thereof, and consequently the propagation of the sound to the piezoelectric element 2 and the detection of the sound by the piezoelectric element 2 are further facilitated. The voids formed in the first sound propagation sheet 3a may be continuous through the first sound propagation sheet 3a in the thickness direction. Due to the voids formed in the first sound propagation sheet 3a being continuous through the first sound propagation sheet 3a in the thickness direction, propagation of the sound incident on the first face toward the second face side is facilitated.

As the first sound propagation sheet 3a having voids, for example, a nonwoven fabric, a woven fabric, paper having voids, a porous sheet, and the like may be used. As the porous sheet, for example, a sheet of the same type as the porous layer 4 may be used.

The first sound propagation sheet 3a and the second sound propagation sheet 3b are preferably flexible. Due to the flexibility, the first sound propagation sheet 3a and the second sound propagation sheet 3b are deformable along the shape and compressive deformation of the piezoelectric element 2. As a result, the first sound propagation sheet 3a and the second sound propagation sheet 3b are capable of covering the piezoelectric element 2 without pressing it, and consequently durability of the piezoelectric element 2 is improved. In addition, due to the flexibility of the first sound propagation sheet 3a, propagation of the vibration caused by the sound incident on the first face thereof toward the piezoelectric element 2 is facilitated, and consequently an improvement of the sound detection accuracy of the piezoelectric element 2 is facilitated.

Both faces of the piezoelectric element 2 may be either fixed to the second face of the first sound propagation sheet 3a and the first face of the second sound propagation sheet 3b, respectively, or may not be fixed thereto. In the case in which the piezoelectric element 2 is not fixed to the first sound propagation sheet 3a and the second sound propagation sheet 3b, the piezoelectric element 2 would not be distorted along the first sound propagation sheet 3a and the second sound propagation sheet 3b, and more accurate detection of the sound and the vibration by the piezoelectric element 2 is facilitated. It is to be noted that, in the case of fixing the both faces of the piezoelectric element 2 to the first sound propagation sheet 3a or the second sound propagation sheet 3b, a fixing procedure is not particularly limited, and may be, for example: fixing by an adhesive or a tacky material; or fixing by friction between a face of the piezoelectric element 2 and a face of the first sound propagation sheet 3a, or between a face of the piezoelectric element 2 and a face of the second sound propagation sheet 3b.

In FIG. 1, the first sound propagation sheet 3a and the second sound propagation sheet 3b are fixed to each other on circumferential edges thereof in a planar view; however, the first sound propagation sheet 3a and the second sound propagation sheet 3b may be an integrated sound propagation sheet. For example, the first sound propagation sheet 3a and the second sound propagation sheet 3b may be formed as a single bag-like sound propagation sheet.

<Advantages>

By virtue of the first sound propagation sheet 3a covering the one face of the piezoelectric element 2, the sensor unit 1 is capable of protecting from damage the one face of the piezoelectric element 2 that detects sound, and consequently capable of maintaining the sound detection accuracy. In addition, since the first sound propagation sheet 3a covering the one face of the piezoelectric element 2 permits the sound that is incident on the first face of the sound propagation sheet 3a to be transmitted toward the second face thereof, the sound entering the sensor unit 1 from the one face side thereof is less likely to be muffled by the first sound propagation sheet 3a, and the sensor unit 1 is capable of detecting both vibration of the vibrating body P and the sound from the one face side. Therefore, the sensor unit 1 used as a pickup for a musical instrument facilitate reproduction of an original tone of the musical instrument.

In addition, since the second sound propagation sheet 3b covers the another face of the piezoelectric element 2, the sensor unit 1 is capable of detecting sound entering the sensor unit 1 from the other face side as well, and damage to the another face of the piezoelectric element 2 is prevented while the sensor unit 1 is mounted to the vibrating body P.

Second Embodiment

Figure 3:
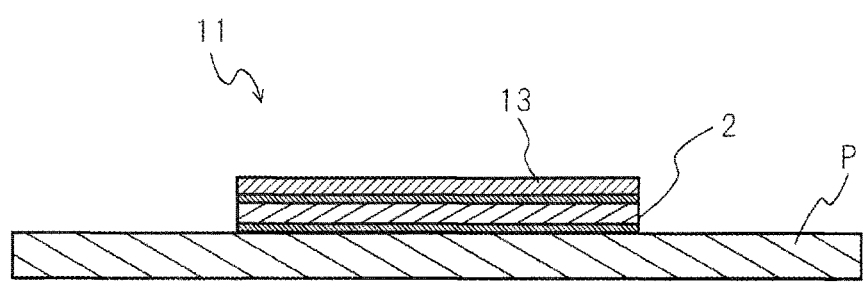
FIG. 3 is a schematic cross sectional view of a sensor unit according to a second embodiment of the present invention.

In the sensor unit 11 of FIG. 3, a sound propagation sheet 13 is disposed to cover the one face of the piezoelectric element 2. In the sensor unit 11, no sound propagation sheet is disposed between the piezoelectric element 2 and the vibrating body P, and therefore the another face of the piezoelectric element 2 is in direct contact with the surface of the vibrating body P. It is to be noted that the piezoelectric element 2 in the sensor unit 11 of FIG. 3 is identical to the piezoelectric element 2 in the sensor unit 1 of FIG. 1, and explanation thereof will be omitted through designating the identical reference numeral.

<Sound Propagation Sheet>

As the sound propagation sheet 13, a sheet of the same type as the first sound propagation sheet 3a in the sensor unit 1 of FIG. 1 may be used. As illustrated in FIG. 3, the sound propagation sheet 13 is fixed to the one face of the piezoelectric element 2 so as to entirely cover the one face of the piezoelectric element 2. As a result, prevention of damage to the piezoelectric element 2 is enabled. Due to the sound propagation sheet 13 permitting sound that is incident on the first face to be transmitted toward the second face, the piezoelectric element 2 is capable of detecting the sound from the one face thereof. A procedure for fixing the sound propagation sheet 13 to the piezoelectric element 2 is not particularly limited, and the sound propagation sheet 13 is fixed to the one face of the piezoelectric element 2 by, for example, an adhesive or a tacky material.

Figure 4:
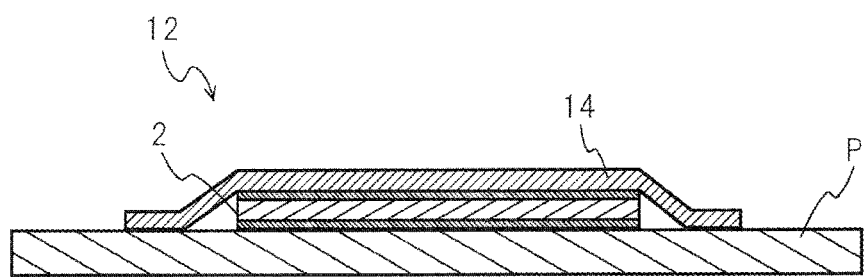
FIG. 4 is a schematic cross sectional view of a sensor unit different in constitution from the sensor unit of FIG. 3.

Next, the sensor unit 12 according to another configuration of the present embodiment is illustrated in FIG. 4. A sound propagation sheet 14 in the sensor unit 12 has such a size that a range surrounded by an outer periphery of the piezoelectric element 2 is covered in a planar view, and covers the one face of the piezoelectric element 2. A circumferential edge of the sound propagation sheet 14 is fixed to the surface of the vibrating body P. As described above, since the sound propagation sheet 14 is fixed to the surface of the vibrating body P, the one face of the piezoelectric element 2 is not required to be fixed to the second face of the sound propagation sheet 14. Due to not fixing the one face of the piezoelectric element 2 to the second face of the sound propagation sheet 14, the piezoelectric element 2 would not be distorted with expansion and contraction of the sound propagation sheet 14 and is therefore capable of detecting the sound with accuracy.

In the sensor unit 12 of FIG. 4, the another face of the piezoelectric element 2 is not required to be fixed to the surface of the vibrating body P. When the piezoelectric element 2 is not fixed to the vibrating body P, the piezoelectric element 2 would not be distorted with expansion and contraction of the vibrating body P and is therefore capable of detecting the vibration of the vibrating body P with accuracy.

<Advantages>

Due to the another face of the piezoelectric element 2 being in direct contact with the surface of the vibrating body P, the sensor unit 11 and the sensor unit 12 are capable of detecting more accurately the vibration of the vibrating body P.

Third Embodiment

Figure 5:
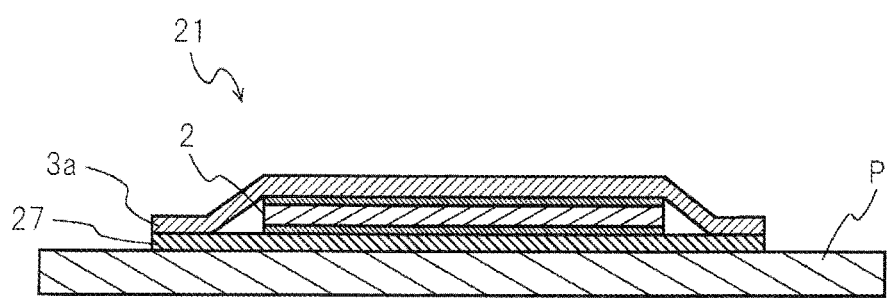
FIG. 5 is a schematic cross sectional view of a sensor unit according to a third embodiment of the present invention.

A sensor unit 21 of FIG. 5 comprises a sheet-like piezoelectric element 2 having a porous layer. The sensor unit 21 further comprises: a first sound propagation sheet 3a that covers the one face of the piezoelectric element 2 and permits sound that is incident on the first face thereof to be transmitted toward the second face thereof; and a sound insulation sheet 27 that covers the another face of the piezoelectric element 2 and substantially prevents sound that is incident on the second face thereof from being transmitted toward the first face thereof. It is to be noted that the first sound propagation sheet 3a and the piezoelectric element 2 in the sensor unit 21 of FIG. 5 are identical to the sound propagation sheet 3a and the piezoelectric element 2 in the sensor unit 1 of FIG. 1, and explanation thereof will be omitted through designating the identical reference numerals.

<Sound Insulation Sheet>

The sound insulation sheet 27 is a substantially rectangular sheet having such a size that a range surrounded by an outer periphery of the piezoelectric element 2 is covered in a planar view, and may be, for example, a rigid body such as a metal plate. The sound insulation sheet 27 is disposed such that the second face is fixed to the surface of the vibrating body P and the first face is in contact with the another face of the piezoelectric element 2. In addition, the circumferential edge of the first sound propagation sheet 3a covering the one face of the piezoelectric element 2 is fixed to a circumferential edge of the first face of the sound insulation sheet 27.

The sound insulation sheet 27 substantially prevents sound that is incident on the second face from being transmitted toward the first face. As a result, sound propagated from the vibrating body P side is largely muffled, and sound from the one face side of the sensor unit 21, i.e., from the external space side, may be preferentially detected by the piezoelectric element 2. Consequently, the piezoelectric element 2 is capable of detecting more accurately the sound from the external space side.

The lower limit of the difference in an acoustic pressure level between the sound incident on the sound insulation sheet 27 and the transmitted sound is preferably 50 dB and more preferably 60 dB. Meanwhile, the upper limit of the difference in the acoustic pressure level is preferably 100 dB and more preferably 90 dB. When the difference in the acoustic pressure level is less than the lower limit, the sound from the vibrating body P side is more likely to be detected by the piezoelectric element 2, and consequently the detection accuracy of the sound from the external space side may be decreased. To the contrary, when the difference in the acoustic pressure level is greater than the upper limit, the sound insulation sheet 27 is required to have an increased thickness and consequently the sensor unit 21 may be unnecessarily large in size.

The lower limit of a surface density of the sound insulation sheet 27 is preferably 500 g/m$^2$ and more preferably 600 g/m$^2$. Meanwhile, the upper limit of the surface density of the sound insulation sheet 27 is preferably 2,000 g/m$^2$ and more preferably 1,500 g/m$^2$. When the surface density is less than the lower limit, the sound from the vibrating body P side may not be sufficiently muffled, and consequently the detection accuracy of the sound from the external space side may be decreased. To the contrary, when the surface density is greater than the upper limit, the sensor unit 21 may be excessively thick and unnecessarily large in size.

The sensor unit 21 of FIG. 5 may also be disposed upside down on the surface of the vibrating body P. In other words, a face of the first sound propagation sheet 3a opposite to the piezoelectric element 2 may be fixed to the surface of the vibrating body P, and the sound insulation sheet 27 may face the external space side. When the sound insulation sheet 27 is relatively large in mass, disposing the sensor unit 21 as described above facilitates propagation of the vibration from the vibrating body P to the piezoelectric element 2, since the sound insulation sheet 27 also serves as a weight. Therefore, in the case of preferentially detecting the vibration from the vibrating body P, the sensor unit 21 disposed as described above is enabled to detect the vibration from the vibrating body P more accurately.

<Advantages>

Due to the sound insulation sheet 27 muffling the transmitted sound from the other face side of the sensor unit 21, the sensor unit 21 is capable of detecting more accurately the sound from the one face side.

Fourth Embodiment

Figure 6:
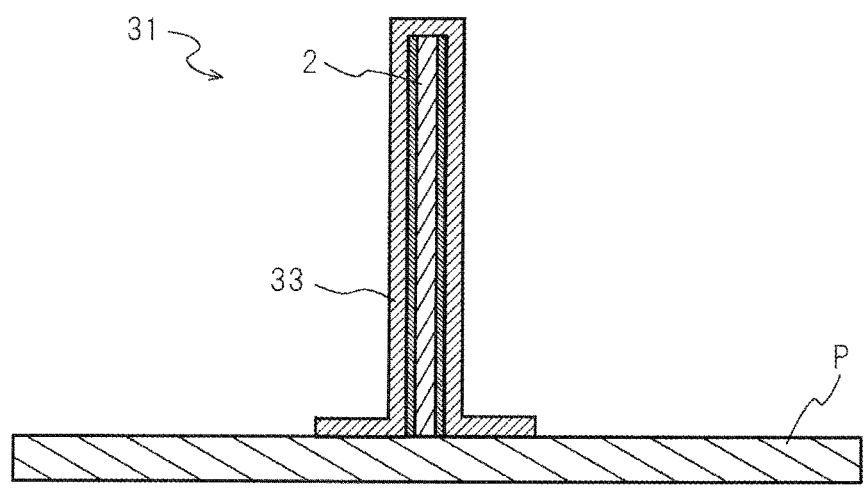
FIG. 6 is a schematic cross sectional view of a sensor unit according to a fourth embodiment of the present invention.

A sensor unit 31 of FIG. 6 comprises a sheet-like piezoelectric element 2 having a porous layer. The sensor unit 31 further comprises a sound propagation sheet 33 that covers both faces of the piezoelectric element 2 and permits sound that is incident on an outer face to be transmitted toward a face on the piezoelectric element 2 side. It is to be noted that the piezoelectric element 2 in the sensor unit 31 of FIG. 6 is identical to the piezoelectric element 2 in the sensor unit 1 of FIG. 1, and explanation thereof will be omitted through designating the identical reference numeral.

<Sound Propagation Sheet>

The sound propagation sheet 33 is, for example, a substantially rectangular sheet having a size at least twice as large as a plane area of the piezoelectric element 2 in a planar view. The sound propagation sheet 33 is folded in half and disposed such that both faces of the piezoelectric element 2 are entirely in contact with a face directed inward. As a result, both faces of the piezoelectric element 2 are covered by the sound propagation sheet 33. The piezoelectric element 2 of which both faces are covered by the sound propagation sheet 33 is disposed such that one edge thereof is in contact with the surface of the vibrating body P. Both ends of the sound propagation sheet 33 thus folded are further folded outward from the piezoelectric element 2, and fixed to the surface of the vibrating body P. Due to both ends of the sound propagation sheet 33 being fixed to the surface of the vibrating body P, the sensor unit 31 is fixed to the vibrating body P. The sensor unit 31 is fixed to the vibrating body P such that the thickness direction of the piezoelectric element 2 is substantially parallel to the surface of the vibrating body P. As the sound propagation sheet 33, a sheet of the same type as the first sound propagation sheet 3a in the sensor unit 1 of FIG. 1 may be used.

Since the sensor unit 31 is disposed such that the thickness direction of the piezoelectric element 2 is substantially parallel to the surface of the vibrating body P, both faces of the piezoelectric element 2 face the external space through the sound propagation sheet 33. Therefore, the sound from the external space is transmitted through the sound propagation sheet 33 and detected by the piezoelectric element 2 at both faces thereof. Due to the piezoelectric element 2 being capable of detecting the sound from the external space at the both faces thereof, the sensor unit 31 is capable of detecting the sound from the external space more accurately.

<Advantages>

Due to the piezoelectric element 2 being capable of detecting the sound from the external space accurately at both faces thereof, the sensor unit 31 may be suitably used as a sensor to be embedded in a microphone and the like.

Mounting Configuration of Sensor Unit

Next, mounting configurations of the sensor unit to the vibrating body P will be described. It is to be noted that in FIGS. 7 to 19 illustrating the mounting configurations of the sensor unit, a sensor unit having the same constitution as that of FIG. 1, 3 or 5 may be used.

<Mounting Configuration 1>

Figure 7:
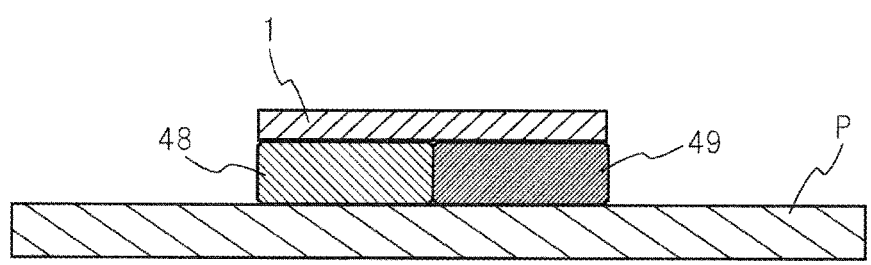
FIG. 7 is a schematic cross sectional view for explaining a mounting configuration of the sensor unit of FIG. 1.

In the configuration illustrated in FIG. 7, a vibration non-transmitting member 48 and a vibration-transmitting member 49 are arranged on the surface of the vibrating body P. The vibration non-transmitting member 48 and the vibration-transmitting member 49 each have a substantially cuboid shape, and arranged such that respective lower faces are in contact with the surface of the vibrating body P and respective lateral faces are in contact with each other. The sensor unit 1 is disposed such that the one face thereof faces the external space, and the other face is in contact with respective upper faces of the vibration non-transmitting member 48 and the vibration-transmitting member 49. The vibration non-transmitting member 48 and the vibration-transmitting member 49 have substantially the same height (distance between the upper face and the lower face), and the upper face of the vibration non-transmitting member 48 and the upper face of the vibration-transmitting member 49 are substantially flush with each other.

(Vibration Non-Transmitting Member)

The vibration non-transmitting member 48 is a member that is unlikely to propagate the vibration of the vibrating body P. Gel, a sponge, and the like constituted of an organic material, an inorganic material, etc. may be used as a material for forming the vibration non-transmitting member 48.

(Vibration-Transmitting Member)

The vibration-transmitting member 49 is a member that is likely to propagate the vibration of the vibrating body P. Wood, ceramic, metal, and the like, for example, may be used as a material for forming the vibration-transmitting member 49. A rigid body formed from these materials, i.e., a matter formed by packing these materials without voids, and the like, may be used as the vibration-transmitting member 49. Alternatively, a material of the same type as the vibrating body P may be used as the vibration-transmitting member 49. Therefore, a protruding part may be formed on the surface of the vibrating body P and used as the vibration-transmitting member.

In a region in which the other face side of the sensor unit 1 is in contact with the upper face of the vibration non-transmitting member 48, the vibration of the vibrating body P is unlikely to be propagated, and therefore the piezoelectric element of the sensor unit 1 preferentially detects the sound from the external space. On the other hand, in a region in which the other face of the sensor unit 1 is in contact with the upper face of the vibration-transmitting member 49, the vibration of the vibrating body P is likely to be propagated, and therefore the piezoelectric element preferentially detects the vibration of the vibrating body P. Therefore, a contact area between the sensor unit 1 and the vibration non-transmitting member 48 as well as a contact area between the sensor unit 1 and the vibration-transmitting member 49 are adjusted through adjustments of the sizes of the vibration non-transmitting member 48 and the vibration-transmitting member 49 in a planar view, or the like, whereby an adjustment of a ratio between the sound and the vibration to be detected by the piezoelectric element is enabled. As a result, a tone of an electronic musical instrument in which the sensor unit 1 is used as a pickup, for example, is enabled to be controlled.

<Mounting Configuration 2>

Figure 8:
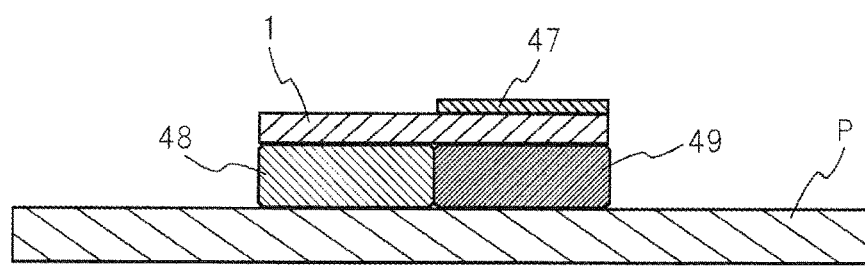
FIG. 8 is a schematic cross sectional view for explaining a mounting configuration of the sensor unit different from that of FIG. 7.

In the configuration illustrated in FIG. 8, in addition to the configuration of FIG. 7, a sheet-like air vibration-insulating member 47 is disposed on the one face of the sensor unit 1, in a region corresponding to the upper face of the vibration-transmitting member 49 in a planar view. It is to be noted that, it is preferred that the air vibration-insulating member 47 is provided in an entire region covering the upper face of the vibration-transmitting member 49 in a planar view, but not in a region covering the upper face of the vibration non-transmitting member 48 in a planar view.

(Air Vibration-Insulating Member)

The air vibration-insulating member 47 is a member that is unlikely to propagate air vibration and likely to propagate vibration from a solid. In other words, due to the air vibration-insulating member 47 being disposed as in FIG. 8, propagation of sound from the external space to the region on the one face of the sensor unit 1 in contact with the air vibration-insulating member 47 is inhibited. For example, a metal plate may be used as the air vibration-insulating member 47.

In the region corresponding to the upper face of the vibration-transmitting member 49 in a planar view in which the vibration of the vibrating body P is preferentially detected, the air vibration-insulating member 47 more reliably inhibits detection of the sound from the external space, while the piezoelectric element is capable of detecting the vibration of the vibrating body P more accurately by virtue of the air vibration-insulating member 47 serving as a weight.

<Mounting Configuration 3>

Figure 9:
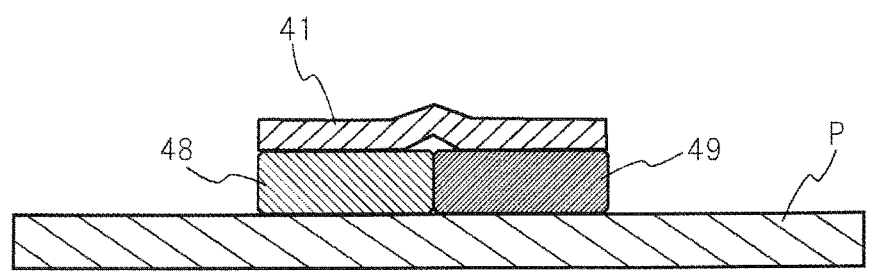
FIG. 9 is a schematic cross sectional view for explaining a mounting configuration of the sensor unit different from those of FIGS. 7 and 8.

In the configuration illustrated in FIG. 9, instead of the sensor unit 1 in the configuration of FIG. 7, a sensor unit 41 is provided. The sensor unit 41 has a sheet-like shape, and formed by, for example, providing a valley fold, a mountain fold, and a valley fold in this order substantially in parallel to each other, in a part between one end and the other end of the sensor unit 1. The sensor unit 41 is disposed such that, given a face on which the mountain fold protrudes being one face, the other face is in contact with the upper face of the vibration non-transmitting member 48 and the upper face of the vibration-transmitting member 49. In addition, the sensor unit 41 is disposed such that a ridge line of the mountain fold corresponds to a boundary between the vibration non-transmitting member 48 and the vibration-transmitting member 49 in a planar view.

Due to the sensor unit 41 being disposed as described above, the vibration propagated by the vibration-transmitting member 49 can be prevented from being propagated to the vibration non-transmitting member 48, and consequently more accurate detection of sound is enabled.

<Mounting Configuration 4>

Figure 10:
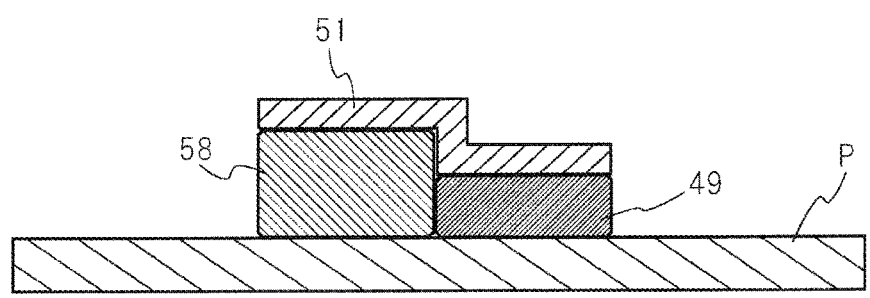
FIG. 10 is a schematic cross sectional view for explaining a mounting configuration of the sensor unit different from those of FIGS. 7 to 9.

In the configuration illustrated in FIG. 10, instead of the vibration non-transmitting member 48 in the configuration of FIG. 7, a vibration non-transmitting member 58 is provided having a substantially cuboid shape and greater in height than the vibration non-transmitting member 48. In addition, instead of the sensor unit 1 in the configuration of FIG. 7, a sensor unit 51 is provided having a shape to be in contact with the upper face of the vibration-transmitting member 49 and the upper face of the vibration non-transmitting member 58. The sensor unit 51 has a sheet-like shape, and formed by, for example, providing a fold on the sensor unit 1 such that the other face is in contact with the upper face of the vibration-transmitting member 49 and the upper face of the vibration non-transmitting member 58 arranged adjacent to each other.

Due to the increased height of the vibration non-transmitting member 58, propagation of the vibration of the vibrating body P to a part of the other face of the sensor unit 51 in contact with the vibration non-transmitting member 58 is further inhibited. As a result, in a region of the piezoelectric element corresponding to the upper face of the vibration non-transmitting member 58, sound detection accuracy is further improved.

<Mounting Configuration 5>

In the configuration illustrated in FIG. 11, instead of the vibration-transmitting member 49 in the configuration of FIG. 7, a vibration-transmitting member 69 is provided having a substantially triangular prism shape. The vibration-transmitting member 69 has a substantially right triangular lateral cross section, and is disposed such that two faces forming the right angle in the lateral cross section are in contact with the surface of the vibrating body P and a lateral face of the vibration non-transmitting member 48, respectively. The lateral face of the vibration-transmitting member 69 in contact with the lateral face of the vibration non-transmitting member 48 has substantially the same height as the vibration non-transmitting member 48.

In addition, instead of the sensor unit 1 of FIG. 7, a sensor unit 61 is provided having a shape to be in contact with the upper face of the vibration non-transmitting member 48 and an inclined face of the vibration-transmitting member 69. The sensor unit 61 has a sheet-like shape, and formed by, for example, providing a fold on the sensor unit 1 such that the other face is in contact with the upper face of the vibration non-transmitting member 48 and the inclined face of the vibration-transmitting member 69 arranged adjacent to each other.

Due to using the vibration-transmitting member 69 having the face inclined with respect to the surface of the vibrating body P, a reduction in a distance between: a region for detecting the vibration on the other face of the sensor unit 61; and the surface of the vibrating body P is enabled. As a result, more accurate detection of the vibration of the vibrating body P is enabled.

<Mounting Configuration 6>

Figure 12:
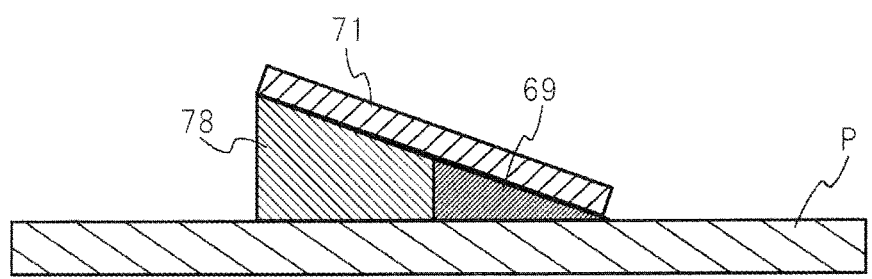
FIG. 12 is a schematic cross sectional view for explaining a mounting configuration of the sensor unit different from those of FIGS. 7 to 11.

In the configuration illustrated in FIG. 12, instead of the vibration non-transmitting member 48 in the configuration of FIG. 11, a vibration non-transmitting member 78 is provided having a substantially quadrangular prism shape with a substantially trapezoidal lateral cross section. The lateral cross section of the vibration non-transmitting member 78 is a trapezoid in which two internal angles are right angles and bases are different in length. The vibration non-transmitting member 78 is disposed such that a lower face, which corresponds to a side forming the right angles with the bases in the lateral cross section, is in contact with the surface of the vibrating body P. Meanwhile, the vibration non-transmitting member 78 is disposed such that a lateral face, which includes a shorter base of the trapezoid as the lateral cross section, is in contact with a lateral face of the vibration-transmitting member 69. The lateral face of the vibration non-transmitting member 78 and the lateral face of the vibration-transmitting member 69 being in contact with each other have substantially the same height, and an inclination angle of an upper face of the vibration non-transmitting member 78 is the same as that of the inclined face of the vibration-transmitting member 69. Therefore, the upper face of the vibration non-transmitting member 78 and the inclined face of the vibration-transmitting member 69 are substantially flush with each other.

In addition, instead of the sensor unit 61 of FIG. 11, a sensor unit 71 is provided having a shape to be in contact with the upper face of the vibration non-transmitting member 78 and an inclined face of the vibration-transmitting member 69. The sensor unit 71 has a planar shape in which both faces are plane.

Due to using the vibration non-transmitting member 78 and the vibration-transmitting member 69 configured such that the upper face of the vibration non-transmitting member 78 and the inclined face of the vibration-transmitting member 69 are substantially flush with each other, the other face of the planar sensor unit 71 is enabled to be in contact with both of the upper face of the vibration non-transmitting member 78 and the inclined face of the vibration-transmitting member 69. As a result, accurate detection of the vibration of the vibrating body P, and easy formation of the sensor unit 71 without the need for bending processing or the like of the sensor unit 71, are enabled.

<Mounting Configuration 7>

In the configuration illustrated in FIG. 13, the vibration non-transmitting member 48 and the vibration-transmitting member 49 in the configuration of FIG. 7 are arranged at an interval. In other words, in the configuration illustrated in FIG. 13, a gap is provided between the vibration non-transmitting member 48 and the vibration-transmitting member 49. As a result, in the configuration illustrated in FIG. 13, the lower face of the sensor unit 1 has: a part in contact with the upper face of the vibration non-transmitting member 48; a part in contact with the upper face of the vibration-transmitting member 49; and a part facing the external space between these members. As a result, in a planar view, the sensor unit 1 has: a region corresponding to the upper face of the vibration non-transmitting member 48; a region corresponding to the upper face of the vibration-transmitting member 49; and an unsupported region between these regions.

Due to arranging the vibration non-transmitting member 48 and the vibration-transmitting member 49 at an interval, avoidance of interference between the vibration non-transmitting member 48 and the vibration-transmitting member 49 is enabled. As a result, the piezoelectric element in the sensor unit 1 achieves improvements in the sound detection accuracy in the region corresponding to the upper face of the vibration non-transmitting member 48 in a planar view; and the detection accuracy for the vibration of the vibrating body P in the region corresponding to the upper face of the vibration-transmitting member 49 in a planar view.

<Mounting Configuration 8>

Figure 14:
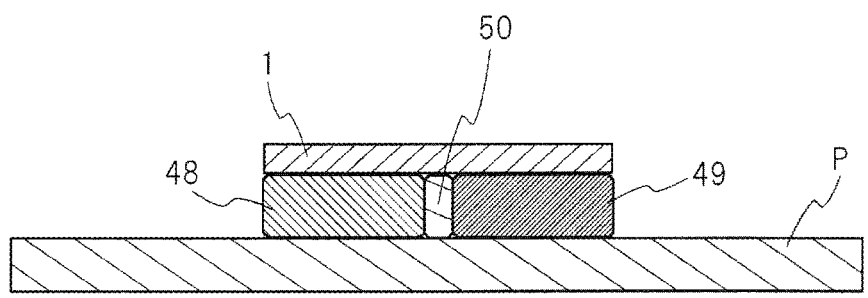
FIG. 14 is a schematic cross sectional view for explaining a mounting configuration of the sensor unit different from those of FIGS. 7 to 13.

In the configuration illustrated in FIG. 14, the vibration non-transmitting member 48 and the vibration-transmitting member 49 in the configuration of FIG. 7 are arranged at an interval, and a sound-absorbing member 50 having a substantially cuboid shape is disposed between the vibration non-transmitting member 48 and the vibration-transmitting member 49. In the configuration illustrated in FIG. 14, one lateral face of the vibration non-transmitting member 48 is in contact with the other lateral face of the sound-absorbing member 50, and one lateral face of the sound-absorbing member 50 is in contact with the other lateral face of the vibration-transmitting member 49. As a result, in the configuration illustrated in FIG. 14, the lower face of the sensor unit 1 has: a part in contact with the upper face of the vibration non-transmitting member 48; a part in contact with the upper face of the sound-absorbing member 50; and a part in contact with the upper face of the vibration-transmitting member 49, which are continuous in one direction. As a result, in a planar view, the sensor unit 1 has: a region corresponding to the upper face of the vibration non-transmitting member 48; a region corresponding to the upper face of the sound-absorbing member 50; and a region corresponding to the upper face of the vibration-transmitting member 49, which are continuous in one direction. As a specific constitution of the sound-absorbing member 50, various kinds of constitutions providing sound absorbency may be employed. For example, a nonwoven fabric, a woven fabric, a member produced by covering a nonwoven fabric or a woven fabric with a synthetic resin, and the like may be used.

Due to the sound-absorbing member 50 disposed between the vibration non-transmitting member 48 and the vibration-transmitting member 49, a reduction of interference between the vibration non-transmitting member 48 and the vibration-transmitting member 49 is enabled. As a result, the piezoelectric element in the sensor unit 1 achieves improvements in the sound detection accuracy in the region corresponding to the upper face of the vibration non-transmitting member 48 in a planar view; and the detection accuracy for the vibration of the vibrating body P in the region corresponding to the upper face of the vibration-transmitting member 49 in a planar view.

<Mounting Configuration 9>

In the configuration illustrated in FIG. 15, the vibration non-transmitting member 48 and the vibration-transmitting member 49 in the configuration of FIG. 7 are arranged at an interval, and a buffer 60 having a substantially cuboid shape is disposed between the vibration non-transmitting member 48 and the vibration-transmitting member 49. In the configuration illustrated in FIG. 15, one lateral face of the vibration non-transmitting member 48 is in contact with the other lateral face of the buffer 60, and one lateral face of the buffer 60 is in contact with the other lateral face of the vibration-transmitting member 49. As a result, in the configuration illustrated in FIG. 15, the lower face of the sensor unit 1 has: a part in contact with the upper face of the vibration non-transmitting member 48; a part in contact with the upper face of the buffer 60; and a part in contact with the upper face of the vibration-transmitting member 49, which are continuous in one direction. As a result, in a planar view, the sensor unit 1 has: a region corresponding to the upper face of the vibration non-transmitting member 48; a region corresponding to the upper face of the buffer 60; and a region corresponding to the upper face of the vibration-transmitting member 49, which are continuous in one direction. As a specific constitution of the buffer 60, a constitution may be employed that is: able to appropriately propagate the sound and the vibration, less likely to propagate the sound than the vibration non-transmitting member 48 is; and less likely to propagate the vibration than the vibration-transmitting member 49 is. For example, a foamed member having a plurality of pores generated by a foaming agent may be used.

Due to being disposed between the vibration non-transmitting member 48 and the vibration-transmitting member 49, the buffer 60 appropriately propagates the sound and the vibration. Thus, the piezoelectric element in the sensor unit 1 is capable of detecting rich sound and vibration. In addition, the piezoelectric element is enabled to detect the sound and the vibration with a desired sensitivity, through adjustment of physical properties of the buffer 60 such as elasticity and density.

<Mounting Configuration 10>

In the configuration illustrated in FIG. 16, a sensor unit 81*a*, a vibration non-transmitting member 88*a*, and a sensor unit 81*b* are laminated, in this order, on the surface of the vibrating body P. The vibration non-transmitting member 88*a* is a sheet-like member in which both faces are plane, having such a size that a range surrounded by an outer periphery of the sensor unit 81*a* and the sensor unit 81*b* is covered in a planar view. The sensor unit 81*a* and the sensor unit 81*b* each have the same shape as, for example, the sensor unit 1 of FIG. 1. As the vibration non-transmitting member 88*a*, a material of the same type as, for example, the vibration non-transmitting member 48 of FIG. 7 may be used.

The sensor unit 81*a* disposed on the other face of the vibration non-transmitting member 88*a* is in direct contact with the surface of the vibrating body P, and detects principally the vibration of the vibrating body P. On the other hand, the sensor unit 81*b* disposed on the one face of the vibration non-transmitting member 88*a* is capable of detecting the sound from the external space accurately, since the vibration non-transmitting member 88*a* inhibits propagation of the vibration of the vibrating body P. Therefore, through an adjustment of a surface area ratio between the sensor unit 81*a* and the sensor unit 81*b*, an adjustment of a ratio between the sound and the vibration to be detected is enabled.

<Mounting Configuration 11>

Figure 17:
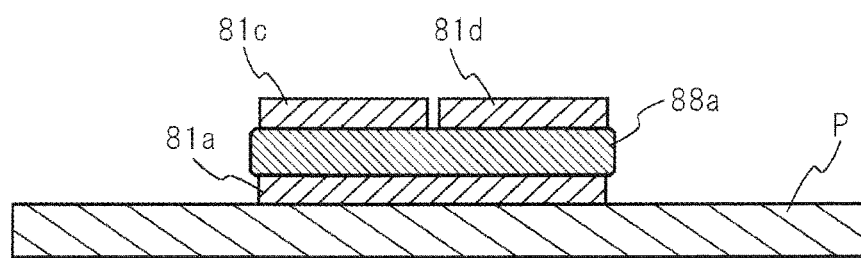
FIG. 17 is a schematic cross sectional view for explaining a mounting configuration of the sensor unit different from those of FIGS. 7 to 16.

In the configuration illustrated in FIG. 17, the sensor unit 81*b* in the configuration of FIG. 16 has been divided into a sensor unit 81*c* and a sensor unit 81*d*, which are arranged on the one face of the vibration non-transmitting member 88*a*.

Due to the divided sensor units for sound detection that enable selection of the sensor unit for sound detection, an adjustment of a ratio between the sound and the vibration to be detected is facilitated.

Although the sensor unit for sound detection has been divided into two in FIG. 17, the sensor unit for sound detection may also be divided into three or more. In addition, the sensor unit 81*a* for vibration detection may also be divided.

<Mounting Configuration 12>

Figure 18:
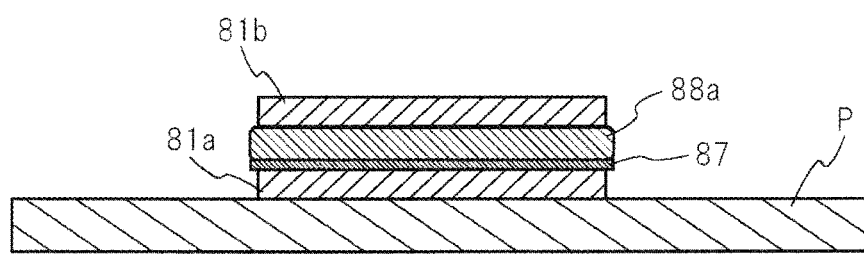
FIG. 18 is a schematic cross sectional view for explaining a mounting configuration of the sensor unit different from those of FIGS. 7 to 17.

In the configuration illustrated in FIG. 18, an air vibration-insulating member 87 is further disposed between the sensor unit 81*a* and the vibration non-transmitting member 88*a* in the configuration of FIG. 16. The air vibration-insulating member 87 is a sheet-like member in which both faces are plane, having such a size that a range surrounded by an outer periphery of the sensor unit 81*a* is covered in a planar view, and the air vibration-insulating member 87 may be, for example, a metal plate.

Due to the air vibration-insulating member 87 being thus disposed, inhibition of propagation of the sound through the vibration non-transmitting member 88*a* to the sensor unit 81*a* is enabled, and consequently an improvement in the detection accuracy of the sensor unit 81*a* for the vibration of the vibrating body P is attained.

<Mounting Configuration 13>

In the configuration illustrated in FIG. 19, a vibration non-transmitting member 88*b* and a sensor unit 81*e* are further disposed in this order on the one face side of the sensor unit 81*b*, in addition to the configuration of FIG. 16. The sensor unit 81*e* has the same shape as, for example, the sensor unit 81*a*. In addition, the vibration non-transmitting member 88*b* has the same shape as, for example, the vibration non-transmitting member 88*a*.

Since the vibration non-transmitting member 88*a* and the vibration non-transmitting member 88*b* are unlikely to propagate the vibration but likely to propagate the sound, the sensor unit 81*b* is unlikely to detect the vibration from the vibrating body P but likely to detect the sound from the external space. Therefore, the vibration of the vibrating body P is detected by the sensor unit 81*a*, while the sound from the external space is detected by the sensor unit 81*b* and the sensor unit 81e. In other words, the configuration of FIG. 19 enables an area of the sensor unit for sound detection to be greater than an area for vibration detection, and in turn enables an increase in a ratio of the sound in the detection.

Furthermore, a lamination including a greater number of vibration non-transmitting members and sensor units enables a further increase in the ratio of the sound in the detection to be achieved.

In this case, the vibration non-transmitting member is preferably formed from a material that is likely to propagate sound, for example a material having continuous pores such as a sponge.

Configuration Example of Piezoelectric Element

Next, a configuration example of the piezoelectric element provided in the sensor unit of the present embodiment will be described.

Figure 20:
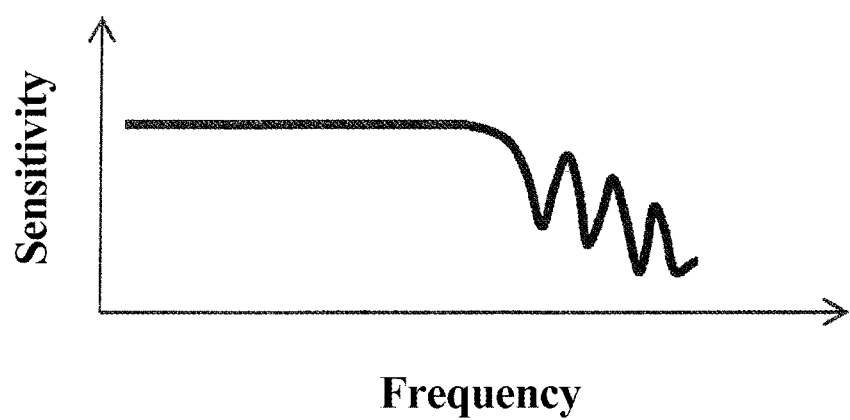
FIG. 20 is a graph conceptually showing a relationship between a frequency of sound and detection sensitivity of the sensor unit.

In a case of detecting sound by using a piezoelectric element comprising a rectangular planar porous body, a wavelength smaller than a width of the piezoelectric element is canceled and therefore undetectable. Therefore, a large area piezoelectric element has a lower sensitivity for a higher frequency. However, in an odd-mode such as a third mode, there are wavelengths which are not canceled even in a high frequency, as shown in FIG. 20.

By reducing an area for sound detection in the piezoelectric element, sensitivity can be made flat even in a higher frequency; however, in such a case, sensitivity is reduced due to a reduced capacitance. The reduction of capacitance may be inhibited through an increase in a surface area of the piezoelectric element. The following configurations of the piezoelectric element enable the increase in the surface area, and in turn the highly sensitive detection of sound even in a high frequency.

Configuration Example 1

Figure 21A:
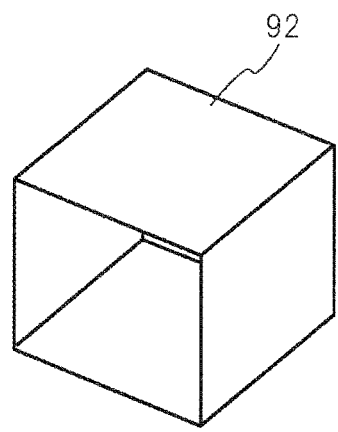
FIG. 21A is a schematic perspective view of a box-shaped piezoelectric element.

A piezoelectric element 92 of FIG. 21A is formed in a box shape. For example, such a configuration in an open-top cuboidal box-like shape enables an about fivefold increase in the surface area of the piezoelectric element compared to that of a sheet-like configuration, leading to an inhibition of the reduction of capacitance.

Figure 21B:
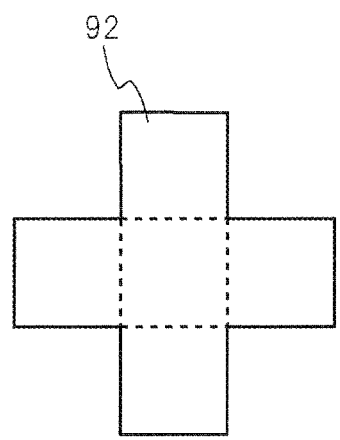
FIG. 21B is a schematic plan view of a configuration of the piezoelectric element of FIG. 21A prior to assembly.

The piezoelectric element 92 of FIG. 21A can be obtained by, for example: forming a planar piezoelectric element in such a shape that a square at the center has four squares connected thereto, each sharing a side with the square at the center in a planar view, as illustrated in FIG. 21B; and then bending the planar piezoelectric element thus formed along the four sides of the square at the center.

Configuration Example 2

Figure 22:
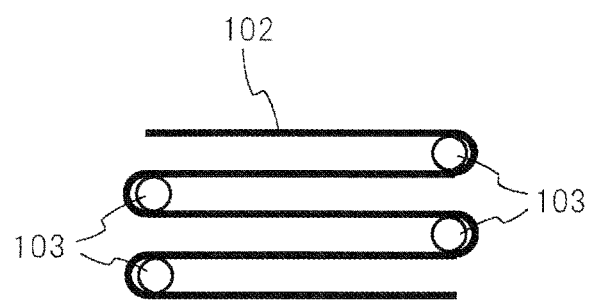
FIG. 22 is a schematic side view of an exemplary assembly configuration of the piezoelectric element different from FIG. 21A.

A piezoelectric element 102 of FIG. 22 is configured such that the piezoelectric element 102 formed in a sheet-like shape is folded around outer peripheries of a plurality of cylindrical spacers 103. Specifically, the piezoelectric element 102 is formed by: arranging the plurality of spacers 103 substantially in parallel with each other, so that the piezoelectric element to be folded around the outer peripheries thereof would be substantially parallel across the spacers 103; and then folding the sheet-like piezoelectric element around the plurality of spacers 103. For example, in the case of the piezoelectric element 102 of FIG. 22, an about fivefold increase in the surface area is enabled, compared to an unfolded piezoelectric element having the same plane area.

Configuration Example 3

Figure 23:
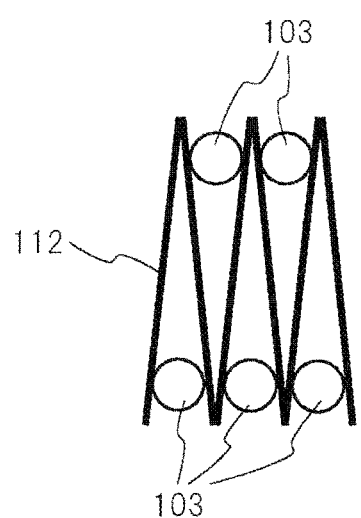
FIG. 23 is a schematic side view of an exemplary assembly configuration of the piezoelectric element different from those of FIGS. 21A and 22.

A piezoelectric element 112 of FIG. 23 is configured such that the piezoelectric element 112 formed in a sheet-like shape is folded at a plurality of positions in an accordion shape, supported by cylindrical spacers 103. Specifically, the piezoelectric element 112 is formed by: arranging the plurality of spacers 103 substantially parallel, at such positions that each fold of the sheet-like piezoelectric element is maintained by insertion between two adjacent spacers 103; and then engaging the sheet-like piezoelectric element folded in an accordion shape with the plurality of spacers 103. For example, in the case of the piezoelectric element 112 of FIG. 23, an about six-fold increase in the surface area is enabled, compared to an unfolded piezoelectric element having the same plane area.

It is to be noted that the piezoelectric elements shown in FIGS. 21A, 22, and 23 may be installed in any desired orientation.

<String Instrument>

A string instrument 121 of FIGS. 24 and 25 comprises principally: a hollow body 123 having a soundboard 122; a bridge 125 that is provided on an outer face side of the soundboard 122 and supports a plurality of strings 124; a saddle 126 provided on an outer face of the bridge 125; a neck 127 that is coupled to the body 123 and extends from one end side of the soundboard 122; and a head 128 provided on one end side of the neck 127. First end sides of the plurality of strings 124 are twisted around and fastened to a plurality of pegs 129 provided on the head 128, respectively, while second end sides of the strings 124 are supported by the bridge 125 through the saddle 126, and are fastened to the plurality of pins 130, respectively. The soundboard 122 has a sound hole 131 between a second end of the neck 127 and the bridge 125.

As illustrated in FIG. 25, a plurality of struts 132 are attached to an inner face of the soundboard 122. In addition, on the inner face of the soundboard 122, a plate 133 positioned opposite to the bridge 125 across the soundboard 122, and a reinforcement board 134 for reinforcing the soundboard 122 are provided.

The string instrument 121 comprises the sensor unit 1 of FIG. 1. The sensor unit 1 is mounted on an inner face of the plate 133. In other words, in the string instrument 121, the plate 133 serves as the vibrating body P, and the sensor unit 1 is provided on the surface of the vibrating body P. The string instrument 121 is configured as an acoustic-electric guitar that converts the vibration of the strings 124 into an electrical signal by means of the sensor unit 121, and outputs the electrical signal.

<Advantages>

In the string instrument 121, the sensor unit 1 is capable of detecting sound generated by the vibration of the vibrating body P and resonance of the body 123 with the vibration of the plurality of strings 124, and consequently an original tone of the musical instrument is converted into an electrical signal and the electrical signal is output.

Other Embodiments

The embodiments described above do not restrict the constituent features of the present invention. Therefore, any omission, substitution and addition of each of the constituent features of the embodiments can be made on the basis of the description of the present specification and common general technical knowledge, and such omitted, substituted and/or added features are to be construed to entirely fall under the scope of the present invention.

For example, as illustrated in FIG. 26, the sensor unit 11 of the second embodiment may also be disposed in an orientation different from that of FIG. 3. In other words, the sensor unit 11 may also be disposed such that the sound propagation sheet 13 is in contact with the surface of the vibrating body P. In this case, for example by using a high strength material for an electrode layer on an opposite side to the sound propagation sheet 13 of the piezoelectric element 2, accurate detection of sound is enabled while damage to the porous layer is inhibited.

Figure 27:
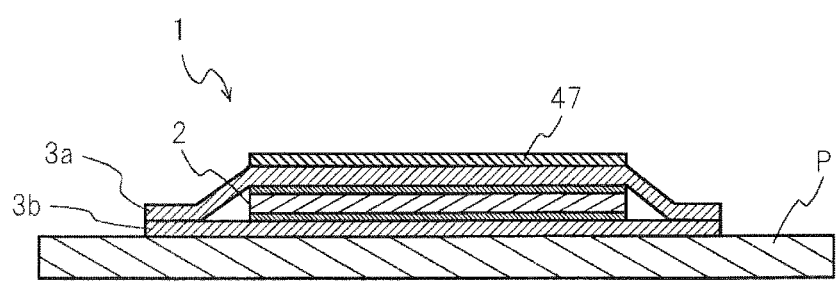
FIG. 27 is a schematic cross sectional view of a sensor unit according to another embodiment of the present invention.

Since the sound propagation sheet disposed on an opposite side to the vibrating body of the sensor units of the first embodiment, the second embodiment, and the third embodiment also serves as a weight, an adjustment of the thickness or a mass of the sound propagation sheet enables alteration of the characteristics to be detected by the piezoelectric element. In addition, a weight 47 may be provided on an opposite side to the vibrating body P of the sensor unit 1 (FIG. 27). Specifically, a sheet formed from a synthetic resin, or a sheet or a plate formed from a metal may be provided on an opposite side to the vibrating body of the sensor unit. In the case in which such a sheet-like weight is provided, the weight may have through-holes for facilitating the propagation of the sound. Furthermore, a cushion layer may also be provided between the sensor unit and the vibrating body. Due to the cushion layer being provided, a reduction of the vibration transmitted from the vibrating body to the sensor unit, and in turn an increase in the ratio of the sound in the detection, are enabled.

The sensor unit is not necessarily mounted on an acoustic-electric guitar. The sensor unit may also be mounted on various types of string instruments such as a classic guitar, a violin, a cello, a mandolin, a piano, and the like, as well as musical instruments other than string instruments, such as percussion instruments. In other words, the musical instrument according to the present invention is not necessarily a string instrument, and may also be configured as a percussion instrument or the like. In addition, a mounting position of the sensor unit is not particularly limited, and the sensor unit may be mounted on an arbitrary vibrating body of a musical instrument. Furthermore, the sensor unit to be mounted on the musical instrument is not limited to the sensor unit of FIG. 1, and any of the sensor units in the aforementioned embodiment may be used.

The sensor unit may be configured as a pickup for a musical instrument to be mounted on a musical instrument, but may also be used in non-musical instruments such as a boundary microphone.

INDUSTRIAL APPLICABILITY

As explained in the foregoing, the sensor unit according to the embodiment of the present invention is capable of detecting both the vibration and the sound while protecting the piezoelectric element. Therefore, the sensor unit is suitably used not only in various types of musical instruments, but also in buildings, machinery, transportation, etc. for detection of abnormal noise and sound as signs of failure.

Explanation of the Reference Symbols 1, 11, 12, 21, 31, 41, 51, 61, 71, 81a, 81b, 81c, 81d, 81e Sensor unit
2, 92, 102, 112 Piezoelectric element
3a Sound propagation sheet
3b Sound propagation sheet
4 Porous layer
5a First electrode layer
5b Second electrode layer
6 Air hole
13, 14, 33 Sound propagation sheet
27 Sound insulation sheet
47, 87 Air vibration-insulating member
48, 58, 78, 88a, 88b Vibration non-transmitting member
49, 69 Vibration-transmitting member
50 Sound-absorbing member
60 Buffer
103 Spacer
121 String instrument
122 Soundboard
123 Body
124 String
125 Bridge
126 Saddle
127 Neck
128 Head
129 Peg
130 Pin
131 Sound hole
132 Strut
133 Plate
134 Reinforcement board
P Vibrating body

The invention claimed is:

1. A sensor unit comprising:
   a sheet-like piezoelectric element having a porous layer; and
   a sound propagation sheet that covers at least one face of the piezoelectric element, the sound propagation sheet being configured to permit sound that is incident on a first face of the sound propagation sheet to be transmitted toward a second face of the sound propagation sheet,
   wherein a surface density of the sound propagation sheet is no less than 0.03 g/m² and no greater than 100 g/m²,
   wherein the sound propagation sheet is flexible, and
   wherein the sound propagation sheet has voids.

2. The sensor unit according to claim 1, wherein a difference in an acoustic pressure level between the sound incident on the sound propagation sheet and the sound transmitted through the sound propagation sheet is no greater than 10 dB.

3. The sensor unit according to claim 1, further comprising a sound insulation sheet that covers another face of the piezoelectric element and substantially prevents sound that is incident on a second face of the sound insulation sheet from being transmitted toward a first face of the sound insulation sheet.

4. A musical instrument comprising the sensor unit according to claim 1.

5. A sensor unit comprising:
   a sheet-like piezoelectric element having a porous layer;
   a sound propagation sheet that covers at least one face of the piezoelectric element, the sound propagation sheet being configured to permit sound that is incident on a first face of the sound propagation sheet to be transmitted toward a second face of the sound propagation sheet;
   a vibrating body provided on a second face of the piezoelectric element; and a sheet-like weight provided on the piezoelectric element such that the sheet-like weight and the vibrating body are disposed on opposite sides of the piezoelectric element, wherein a surface density of the sound propagation sheet is no less than 0.03 g/m² and no greater than 100 g/m², wherein the sound propagation sheet is flexible, and wherein the sound propagation sheet has voids.

6. A musical instrument comprising the sensor unit according to claim 5.

\* \* \* \* \*